• • • US010547375B1

(12) United States Patent
Iyer et al.

(10) Patent No.: US 10,547,375 B1
(45) Date of Patent: Jan. 28, 2020

(54) EFFICIENT RESOURCE ALLOCATION FOR SATELLITE LTE NETWORKS

(71) Applicant: LOCKHEED MARTIN CORPORATION, Bethesda, MD (US)

(72) Inventors: Suresh K. Iyer, Germantown, MD (US); Dilip S. Gokhale, Germantown, MD (US)

(73) Assignee: Lockheed Martin Corporation, Bethesda, MD (US)

(*) Notice: Subject to any disclaimer, the term of this patent is extended or adjusted under 35 U.S.C. 154(b) by 0 days.

(21) Appl. No.: 15/846,108

(22) Filed: Dec. 18, 2017

Related U.S. Application Data

(60) Provisional application No. 62/458,539, filed on Feb. 13, 2017.

(51) Int. Cl.
*H04W 72/14* (2009.01)
*H04B 7/185* (2006.01)
*H04W 28/02* (2009.01)
*H04W 72/12* (2009.01)

(52) U.S. Cl.
CPC .... *H04B 7/18539* (2013.01); *H04W 28/0278* (2013.01); *H04W 72/1268* (2013.01); *H04W 72/14* (2013.01)

(58) Field of Classification Search
CPC .......... H04B 7/18539; H04W 28/0278; H04W 72/14
USPC .................. 455/430, 343, 13.2; 370/328, 338
See application file for complete search history.

(56) References Cited

U.S. PATENT DOCUMENTS

| 6,570,859 | B1 | 5/2003 | Cable |
| 9,930,613 | B2 | 3/2018 | Starsinic |
| 2002/0041328 | A1 | 4/2002 | LeCompte |
| 2004/0185775 | A1 | 9/2004 | Bell |
| 2008/0159419 | A1 | 7/2008 | Smith |
| 2010/0068993 | A1* | 3/2010 | Khan ................... H04B 7/1853 455/12.1 |
| 2010/0280907 | A1* | 11/2010 | Wolinsky ........... G06Q 30/0248 705/14.69 |

(Continued)

FOREIGN PATENT DOCUMENTS

| EP | 2793530 | 10/2014 |
| KR | 2013-0125280 | 11/2013 |

(Continued)

OTHER PUBLICATIONS

3GPP, Non-Access Startum (NAS) Protocl for Evolved Packet Systems (EPS); Stage 3 (Release 14, Dec. 2016, 3Gpp, Version 14.2.0, 470 pages.

*Primary Examiner* — Congvan Tran
(74) *Attorney, Agent, or Firm* — Morgan, Lewis & Bockius LLP

(57) ABSTRACT

A method for uplink and downlink scheduling in a satellite long-term evolution (LTE) network includes receiving, at a satellite base station, a scheduling request from a terminal device. The method further includes transmitting an uplink and downlink grant to the terminal device with an initial allocation that supports the configured data rate. User data is sent and received from the terminal device based on this initial allocation without continually sending grants to the terminal device. The method also supports changes to the persistent allocation based on updated user traffic requirements as indicated by the terminal device.

20 Claims, 6 Drawing Sheets

(56) References Cited

U.S. PATENT DOCUMENTS

| | | | |
|---|---|---|---|
| 2012/0058791 A1 | 3/2012 | Bhattad | |
| 2012/0063302 A1 | 3/2012 | Damnjanovic | |
| 2012/0154055 A1 | 6/2012 | Yamamoto | |
| 2013/0195002 A1 | 8/2013 | Walker | |
| 2013/0336256 A1* | 12/2013 | Chung | H04W 72/042 370/329 |
| 2014/0226502 A1 | 8/2014 | Behnamfar | |
| 2014/0293937 A1* | 10/2014 | Lee | H04L 5/0007 370/329 |
| 2015/0071169 A1 | 3/2015 | Wang | |
| 2015/0319567 A1* | 11/2015 | Edge | H04W 4/02 455/436 |
| 2015/0327328 A1* | 11/2015 | Novak | H04W 72/085 455/11.1 |
| 2016/0192277 A1 | 6/2016 | Starsinic | |
| 2016/0219569 A1 | 7/2016 | Kuo | |
| 2016/0241325 A1* | 8/2016 | Raghothaman | H04W 36/00 |
| 2016/0366687 A1 | 12/2016 | Guo | |
| 2017/0019882 A1* | 1/2017 | Nimbalker | H04W 72/042 |
| 2017/0019914 A1* | 1/2017 | Rune | H04W 72/1284 |
| 2017/0041830 A1 | 2/2017 | Davis | |
| 2017/0094512 A1 | 3/2017 | Kiss | |
| 2017/0195930 A1 | 7/2017 | Tomici | |
| 2017/0332416 A1 | 11/2017 | Kiss | |
| 2018/0092157 A1* | 3/2018 | Chen | H04W 76/27 |
| 2018/0146445 A1* | 5/2018 | Lee | H04W 56/00 |
| 2018/0227752 A1 | 8/2018 | Teyeb | |
| 2018/0270703 A1* | 9/2018 | Kodali | H04W 28/0278 |
| 2018/0295651 A1* | 10/2018 | Cao | H04W 76/27 |
| 2018/0352547 A1* | 12/2018 | Tabet | H04L 1/1812 |
| 2018/0376384 A1 | 12/2018 | Youn | |
| 2019/0052603 A1 | 2/2019 | Wu | |
| 2019/0124561 A1 | 4/2019 | Faccin | |

FOREIGN PATENT DOCUMENTS

| | | |
|---|---|---|
| KR | 2013-0125281 | 11/2013 |
| KR | 2016-0053562 | 5/2016 |
| WO | WO 2013/086917 | 6/2013 |
| WO | WO 2013/168872 | 11/2013 |
| WO | WO 2013/168880 | 11/2013 |
| WO | WO 2017/045123 | 3/2017 |

* cited by examiner

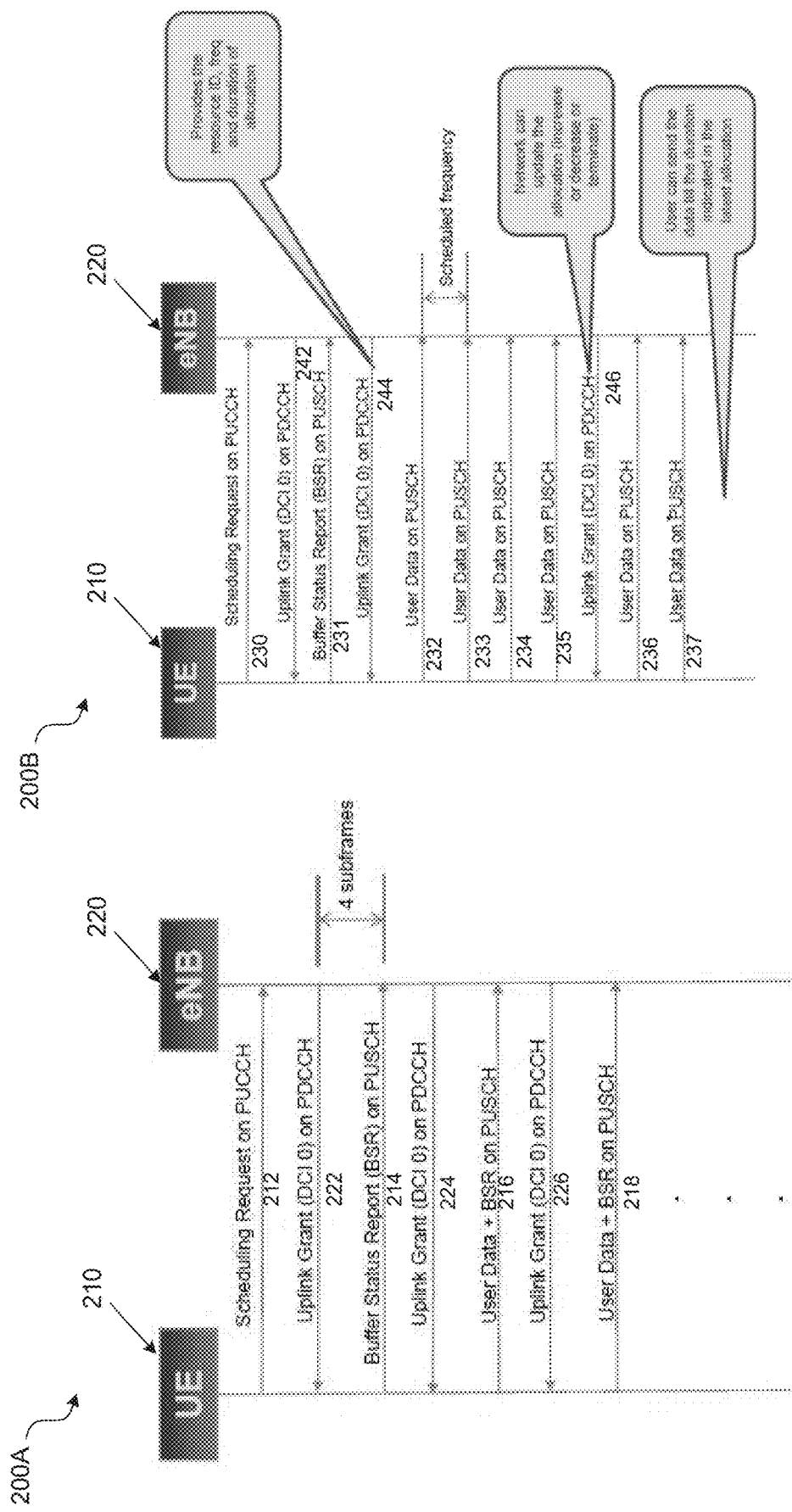

EFFICIENT RESOURCE ALLOCATION FOR SATELLITE LTE NETWORKS

CROSS-REFERENCE TO RELATED APPLICATIONS

This application claims the benefit of priority under 35 U.S.C. § 119 from U.S. Provisional Patent Application 62/458,539 filed Feb. 13, 2017, which is incorporated herein by reference in its entirety.

STATEMENT REGARDING FEDERALLY SPONSORED RESEARCH OR DEVELOPMENT

Not applicable

FIELD OF THE INVENTION

The present invention generally relates to satellite communications, and more particularly, to an efficient resource allocation for satellite long-term evolution (LTE) networks.

BACKGROUND

There is significant interest in using the 4G long term evolution (LTE) physical layer over satellite links. Mobile satellite networks are increasingly assessing the use of LTE as the air interface (radio access technology) for next generation systems. Using the widely deployed, field proven LTE physical layer in conjunction with associated Layer 2 and 3 radio access technologies can be very beneficial for satellite networks. LTE technology provides several benefits, for example, seamless support for 4G and/or evolved packet system (EPS)-based services, a range of standardized modulation and coding schemes and standardized resource definitions (e.g., frequency and time) that are well suited for 4G and/or EPS services. LTE technology further supports dynamic control of modulation/coding depending upon link and terminal characteristics, supports dynamic resource allocation depending upon user traffic needs and is compatible with the evolved packet core (EPC) network via the S1 interface. There are, however, a number of areas where LTE default protocols and/or procedures need to be modified for use in a satellite environment.

SUMMARY

According to various aspects of the subject technology, methods and configuration for an efficient resource allocation solution for satellite long-term evolution (LTE) networks are provided. In some aspects, the subject technology addresses non-effectivity of the LTE standard procedures in a satellite environment, such as long propagation delay, limited frequency resources, large beam sizes and higher user density. The subject technology provides solutions for uplink and downlink resource allocation, which is affected by the satellite network.

In one or more aspects, a method for uplink scheduling in a satellite LTE network, the method includes receiving, at a satellite base station, a scheduling request from a terminal device. An uplink grant is transmitted to the terminal device with an initial allocation that supports the configured data rate. User data is periodically received from the terminal device based on the initial allocation without sending a respective uplink grant to the terminal device.

In one or more other aspects, a method for downlink scheduling in a satellite LTE network includes scheduling by a satellite base station receptions of user data. A downlink control information (DCI) message is transmitted to a terminal device to provide the terminal device with downlink information. User data is periodically transmitted to the terminal device based on the downlink information without sending a respective DCI message to the terminal device for individual user data transmitted to the terminal device.

In yet one or more other aspects, a system for efficient update to existing resource allocation for satellite long-term evolution (LTE) networks includes a satellite base station and a terminal device that is in communication with the satellite base station. The satellite base station may receive a scheduling request from the terminal device and may transmit an uplink grant to the terminal device with an initial allocation that supports a basic data rate. The satellite base station may periodically receive user data from the terminal device based on the initial allocation without sending a respective uplink grant to the terminal device for individual user data received from the terminal device.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein:

FIGS. 2A-2B are timing diagrams illustrating uplink scheduling in an LTE network and in a satellite radio network, according to certain aspects of the disclosure.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The present disclosure is directed, in part, to systems and configurations for efficient resource allocation in satellite long-term evolution (LTE) networks. In one or more aspects, the subject technology provides solutions for both uplink and downlink resource allocation procedures, reduces overhead and improves system capacity utilization to addresses ineffectiveness of the LTE standard procedures in a satellite environment.

The disclosed technology addresses non-effectivity of the LTE standard procedures in a satellite environment. There are several reasons for non-effectivity of the LTE standard procedures in a satellite environment. For example, long propagation delay (e.g., 250 to 270 msec), limited frequency resources, large beams sizes (e.g., relative to terrestrial) and higher user density as a function of resources in a beam. An important LTE procedure that is affected by the satellite network is the uplink and downlink resource allocation procedure, which is addressed by the subject disclosure.

Figure 1:
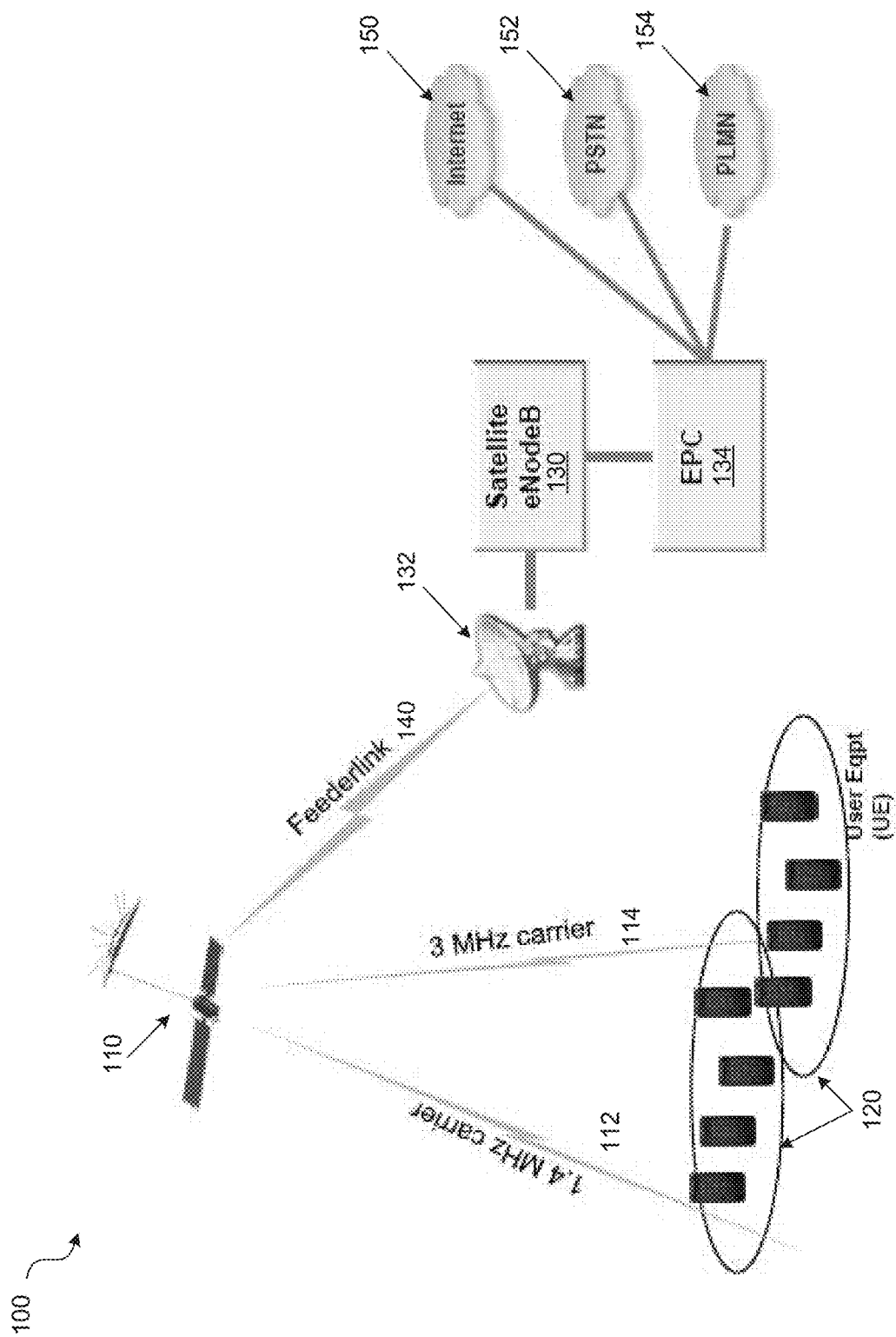
FIG. 1 is a high-level diagram illustrating an example environment for deployment of EPS services over a satellite radio network, according to certain aspects of the disclosure.

FIG. 1 is a high-level diagram illustrating an example environment 100 for deployment of EPS services over a satellite radio network, according to certain aspects of the disclosure. The environment 100 includes a space vehicle (e.g., a satellite) 110, a number of terminal devices 120, a satellite base station (e.g., eNodeB or eNB) 130, a satellite antenna (e.g., a reflector antenna, such as a dish antenna) 132, an EPC 134 communicatively coupled to a number of networks such as the Internet 150, a public switched telephone network (PSTN) 152 and public land mobile network (PLMN) 154. The terminal devices 120, also referred to as user equipment (UE), stations (STAs) or terminals are coupled to the satellite 110 via a number of LTE communication channels such as channel 112 (e.g., 1.4 MHz carrier channel) and 114 (e.g., 3 MHz carrier channel). Examples of the terminal devices 120 include mobile phone, tablets, laptops, phablets, personal digital assistants (PDAs) and other mobile communication devices. The satellite eNB 130 is coupled to the satellite antenna 132 that communicates with the satellite 110 via a feederlink 140. In some aspects, the subject technology discloses an efficient uplink and downlink resource allocation in the satellite LTE network of the environment 100.

FIGS. 2A-2B are timing diagrams illustrating uplink scheduling 200A and 200B in an LTE network and in a satellite radio network, according to certain aspects of the disclosure. It is known that the LTE resource allocation functionality is a media access control (MAC) layer functionality at the eNB (e.g., 130 of FIG. 1) and is responsible for both uplink and downlink dynamic allocations discussed herein. The resource allocations are performed at subframe (e.g., 1 ms) granularity. The uplink allocation scheme is based on a request-response model, in which a mobile device (e.g., UE 210) indicates its resource requirement with a status report message that gets a small allocation. Using this small allocation, actual resource need is requested through a buffer status report (BSR) message. The eNodeB (e.g., eNB 220) signals allocated resources through a downlink control information (DCI) message on a physical downlink control channel (PDCCH) (e.g., in the Nth frame). The UE 210 uses the allocated resources in the N+4th frame to send the uplink data, and additional transactions are initiated to send more data. The uplink scheduling 200A shown in FIG. 2A illustrates the above steps as performed in an LTE network.

For example, the UE 210 may send a scheduling request (SR) 212 over a physical uplink control channel (PUCCH) to the eNB 220. The PUCCH may be allocated to the UE 210 in a radio access control (RRC) connection setup. The scheduling request 212 may be triggered by the MAC layer of the UE 210 when a regular BSR has been triggered and the UE 210 does not have uplink resources for transmission of at least the regular BSR. The regular BSR is triggered when data becomes available for transmission in the uplink. The scheduling request 212 may be sent by the UE 210 as a known uplink control information (UCI) format 1. In response to receiving the scheduling request 212, the eNB 220 sends an uplink grant 222 (e.g., DCI 0) on a physical down control channel (PDCCH) to the UE 210. In the subsequent 4 subframes, the UE 210 send a BSR 214 on a physical uplink shared channel (PUSCH) to the eNB 220. The eNB 220 then sends an uplink grant 224 on the PDCCH to the UE 210. The UE 210 decodes DCI 0 and transmits user data and BSR 216 on the PUSCH based on resource blocks (RBs) specified in the DCI 0. The eNB 220 sends further uplink grant 226 (e.g., DCI 0) to the UE 210 via the PDCCH. The UE 210 transmits user data and BSR 218 on the PUSCH and the BSR request and/or response procedure continues until the user has no more data to send.

The above discussed LTE uplink scheduling has several disadvantages. For example, the long delay of the LTE network, the control channel overhead and the large number of users. The handshake method of allocating resources in LTE networks can significantly reduce maximum data rate available to a single user due to long delay in satellite networks. For instance, in a geosynchronous satellite network, the roundtrip delay can be approximately 540 ms. Therefore, every request and/or response pair may take at least ~540 ms which allows the user to send packets approximately every 540 ms. This delay not only restricts the maximum feasible data rate, but it is not conducive to transmission control protocol (TCP) congestion control algorithms (e.g., a TCP slow start) either.

Regarding the control channel overhead, the PDCCH channel used for communicating allocations is limited in capacity and can restrict resource allocation to only a limited number of bits available on a subframe for communicating resource allocations. Further, increasing the bits for PDCCH increases overhead and reduces capacity for user traffic.

With respect to the large number of active users in satellite networks, the LTE messaging protocol can waste capacity in such a network with large number of users that individually require low data rates. For instance, with the smallest LTE carrier (e.g., 1.4 MHz) only a single user can be signaled every subframe (1 msec) even if there are 6 RBs to be allocated. If less than 6 RBs are allocated to the user, the rest of the RBs are wasted as the signaling channel cannot carry the allocations for other users.

The subject technology discloses a solution that overcomes the above-discussed disadvantages of the LTE uplink scheduling. The uplink scheduling 200B shown in FIG. 2B illustrates uplink scheduling in a satellite LTE network, according to aspects of the subject technology. The UE 210 has PUCCH allocation from RRC connection, as mentioned above, and sends a scheduling request 230 on the PUCCH to the eNB 220. The scheduling request 230 is sent as UCI format 1. The eNB 220 sends an uplink grant 242 (e.g., DCI 0) on PDCCH. The UE 210 sends a BSR 231 on PUSCH. The eNB 220 sends uplink grant 244 (e.g., DCI 0) on PDCCH with an initial allocation that supports a basic data rate. The allocation indicates the resources with the corresponding access periodicity and the duration.

The UE 210 decodes DCI 0 and transmits BSR 231 on the PUSCH based on the persistent allocation. The UE 210 user can use this allocation for data transfer at specified periodicity and transmit user data using messages, for example, 232-235 till the corresponding duration ends. The eNB 220 uses the BSR information to calculate the new data rate and sends an update to the allocation (e.g., expanding it or shrinking it). The eNB 220 may also asynchronously update the user allocation based on establishment of guaranteed bit rate bearers (e.g., EPC trigger). The eNB 220 may factor in requirements of all users in the network when allocating resources to an individual user. The eNB 220 sends uplink grant 244 (e.g., DCI 0) on PDCCH. The UE 210 can use the updated allocation for data transfer and transmit user data using messages, for example, 236-237 till the corresponding duration in the latest allocation ends.

For uplink resource allocations, as discussed above, the disclosed scheme has the following advantages over the standard LTE scheme. The disclosed scheme supports allocation of full uplink capacity to a single user in long delay LTE networks. The reduction in bandwidth allocation latency also minimizes long delay impact on TCP and TCP-friendly protocols. The increased compatibility with fair share allocation, which enables rate-based computations that supports allocation to large number of small data rate users. Using a common scheme for both guaranteed and non-guaranteed bit rate bearers reduces PDCCH resource requirements.

Figures 3A, 3B:
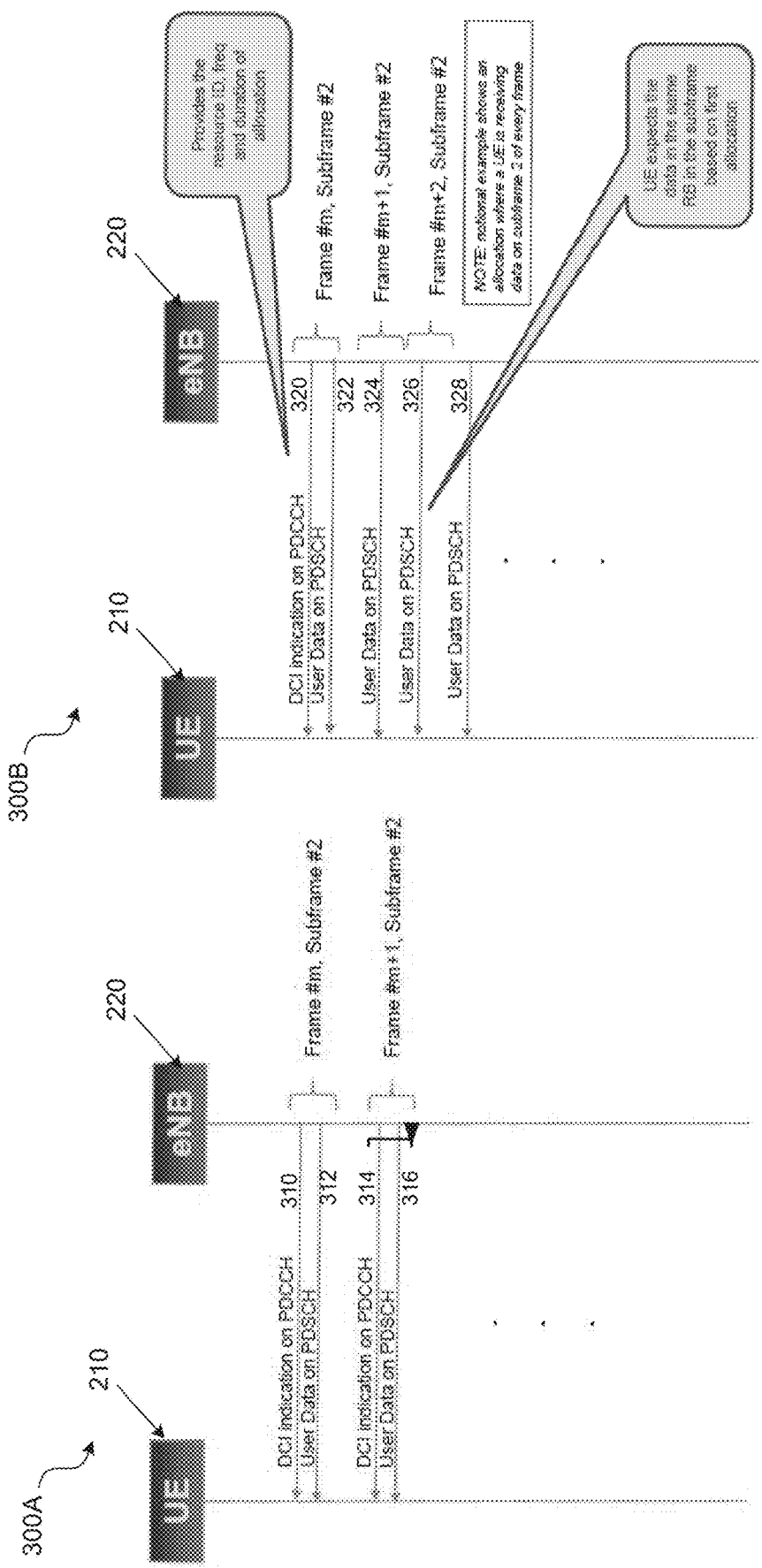
FIGS. 3A-3B are timing diagrams illustrating downlink scheduling in an LTE network and in a satellite radio network, according to certain aspects of the disclosure.

FIGS. 3A-3B are timing diagrams illustrating downlink scheduling 300A and 300B in an LTE network and in a satellite radio network, according to certain aspects of the disclosure. In LTE networks, the downlink allocation scheme is based on an indication model. The eNB 220 packs a downlink message into a resource block and indicates the location of this resource through a DCI message on the PDCCH channel. In Release 9, LTE has incorporated a semi-persistent allocation model to support guaranteed bit rate (GBR) services such as VOIP with L3 messaging issues with the LTE uplink resource allocation procedure for satellite networks.

The downlink scheduling 300A shown in FIG. 3A in an LTE downlink scheme. The eNB 220 schedules user data on downlink PDSCH, and sends a DCI message 310 to the UE 210 on the PDCCH (e.g., in a frame m and subframe 2). The eNB 220 identifies RBs containing the user data in the DCI message, and the PDSCH is in the same subframe. The UE 210 decodes the DCI message 310 and transmits user data. The eNB 220 sends another DCI message 314 to the UE 210 on the PDCCH in a subframe 2 of a subsequent frame m+1. The eNB 220 identifies RBs containing the user data in a message 316 sent on PDSCH in the same subframe. The process repeats at the eNB 220 and UE 210. It is understood that the depiction in FIG. 3A does not show the acknowledge (ACK) messaging, since a hybrid automatic repeat request (HARQ), which uses these ACKs, is not used in satellite LTE networks.

The LTE downlink scheduling scheme discussed above has a number of shortcomings with regard to satellite network application. Examples of these shortcomings include control channel overhead and not being able to handle the large number of active users of the satellite network. The PDCCH channel used for communicating allocations is limited in capacity and can restrict resource allocation. For instance, only a limited number of bits are available on a subframe for communicating resource allocations, and increasing the bits for PDCCH, increases overhead and reduces capacity for user traffic.

The LTE messaging protocol wastes capacity in a network with a large number of users with small bandwidth requirements, as is the case with satellite networks. For instance, with the smallest LTE carrier (1.4 MHz) only a single user can be signaled every subframe (1 ms) even if there are 6 RBs to be allocated. If a single RB (or less than 6 RBs) is allocated to the user, the rest of the RBs are wasted as the signaling channel cannot carry the allocations for other users. For Downlink Resource allocations, the disclosed scheme is advantageous over the standard LTE scheme because it reduces PDCCH resource requirements, supports allocation to large number of small data rate users and employs a common scheme for both guaranteed and non-guaranteed bit rate bearers.

The downlink scheduling 300B shown in FIG. 3B in the LTE downlink scheme of the subject technology. The eNB 220 schedules user data on the PDSCH and sends a DCI indication message 320 to the UE 210 on PDCCH with DCI message. The eNB 220 identifies RBs containing the user data and indicates the frequency and duration of the allocation in the DCI message 320 sent on PDSCH in the same subframe. The UE 210 decodes the DCI message 320 and transmits user data. The eNB 220 sends further data, using the same RBs but without any PDCCH DCI indications, in a number of consequent messages, for example, 324-328. The UE 210 expects to receive data on the same RBs in the subframe based on the first allocation. In some aspects, the eNB 220 can update or terminate the allocation by sending a new DCI message on PDCCH. In some aspects, the eNB 220 can change DCI updates based on data arrival rate for the user from the network side. Thus the subject technology conserve resources at least by avoiding sending repeated DCI indication messages with each user data downlink.

Figure 4:
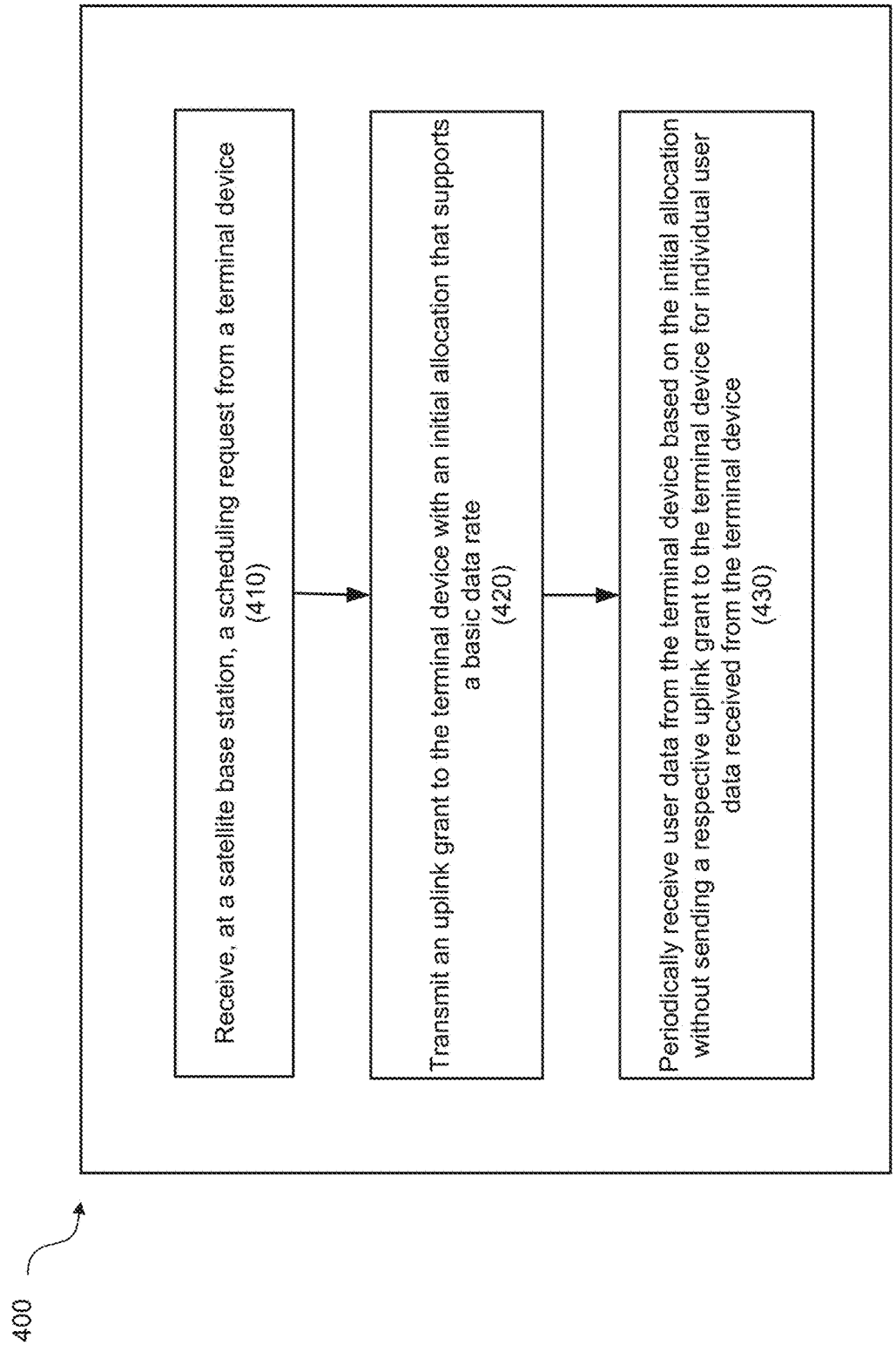
FIG. 4 is a flow diagram illustrating an example method of uplink scheduling in a LTE over satellite network, according to certain aspects of the disclosure.

FIG. 4 is a flow diagram illustrating an example method 400 of uplink scheduling in a LTE over satellite network (e.g., 100 of FIG. 1), according to certain aspects of the disclosure. The method 400 includes receiving, at a satellite base station (e.g., 130 of FIG. 1), a scheduling request (e.g., 230 of FIG. 2B) from a terminal device (e.g., 120 of FIG. 1) (410). An uplink grant is transmitted (e.g., 242 of FIG. 2B) to the terminal device with an initial allocation that supports a basic data rate (420). User data is periodically received (e.g., 232-235 of FIG. 2B) from the terminal device based on the initial allocation without sending a respective uplink grant to the terminal device for individual user data received from the terminal device (430).

Figure 5:
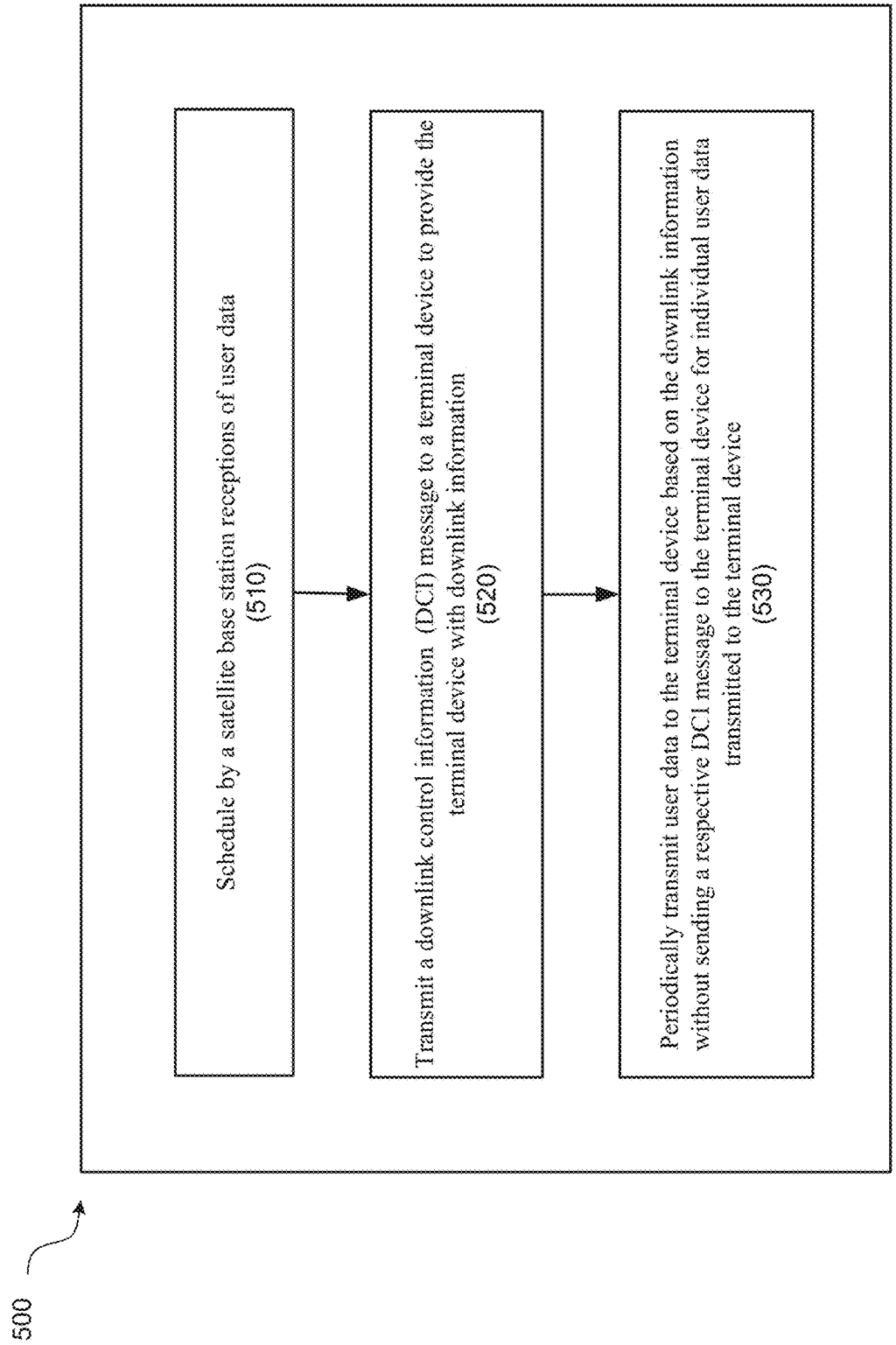
FIG. 5 is a flow diagram illustrating an example method of downlink scheduling in a LTE over satellite network, according to certain aspects of the disclosure.

FIG. 5 is a flow diagram illustrating an example method 500 of downlink scheduling in a LTE over satellite network, according to certain aspects of the disclosure. The method 500 includes scheduling by a satellite base station (e.g., 130 of FIG. 1) reception of user data (510). A downlink control information (DCI) message is transmitted (e.g., 320 of FIG. 3B) to a terminal device (e.g., 120 of FIG. 1), to provide the terminal device with downlink information (520). User data is periodically transmitted (e.g., 322, 324, 326 and 328 of FIG. 3) to the terminal device based on the downlink information without sending a respective DCI message to the terminal device for individual user data transmitted to the terminal device (530).

Figure 6:
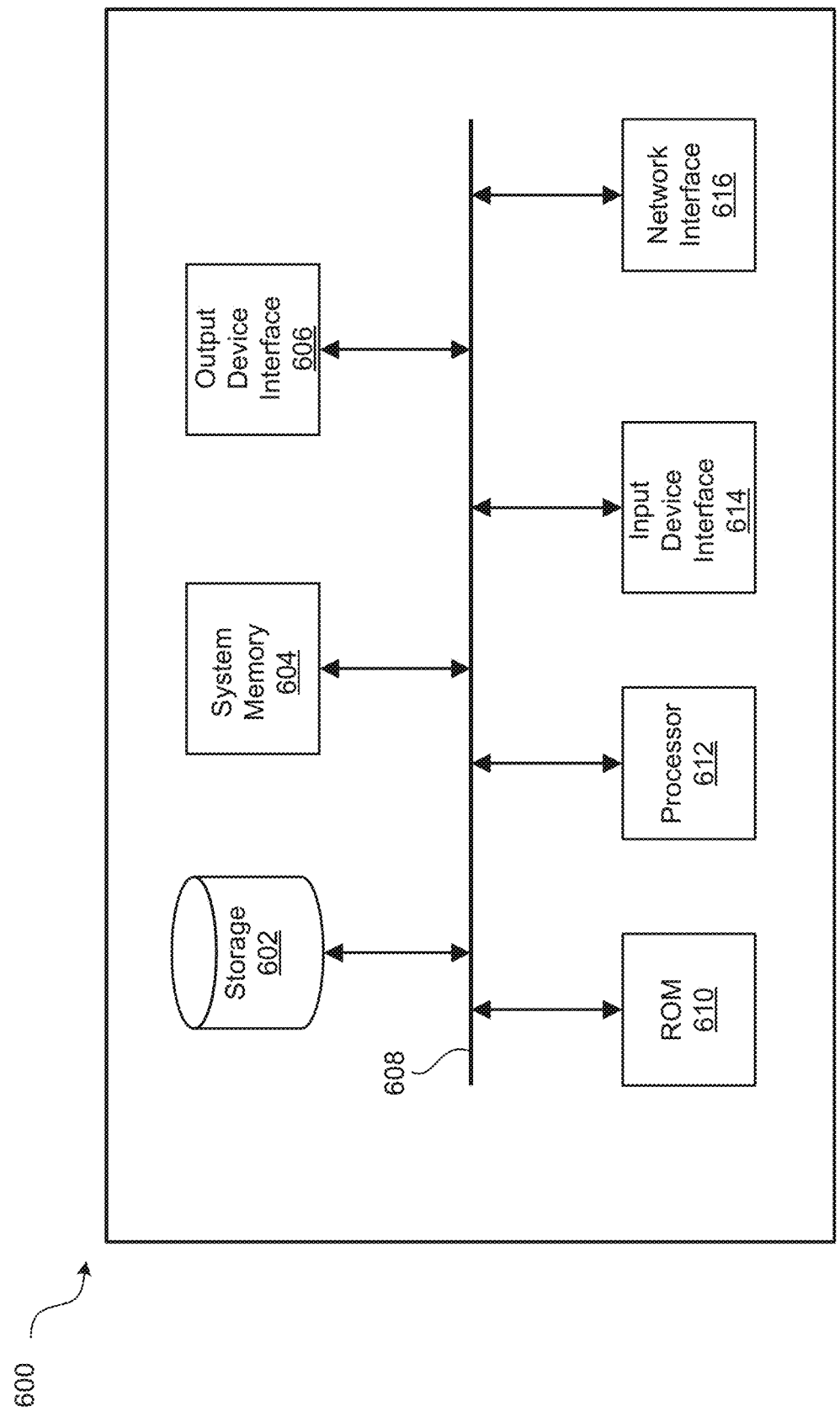
FIG. 6 is a block diagram conceptually illustrating an electronic system 900 with which aspects of the subject technology are implemented.

FIG. 6 is a block diagram conceptually illustrating an electronic system 600 with which aspects of the subject technology are implemented. Electronic system 600, for example, can be a desktop computer, a laptop computer, a tablet computer, a server, a switch, a router, a base station, a receiver, a phone, a personal digital assistant (PDA), or generally any electronic device that has processing power and memory and communication capability. In some implementations, the electronic system 600 may represent the terminal device 120 (e.g., UE) of FIG. 1 or UE 210 of FIGS. 2A and 2B. Such an electronic system may include various types of computer readable media and interfaces for various other types of computer readable media. Electronic system 600 includes bus 608, processing unit(s) 612, system memory 604, read-only memory (ROM) 610, permanent storage device 602, input device interface 614, output device interface 606, and network interface 616, or subsets and variations thereof.

Bus 608 collectively represents all system, peripheral, and chipset buses that communicatively connect the numerous internal devices of electronic system 600. In one or more implementations, bus 608 communicatively connects processing unit(s) 612 with ROM 610, system memory 604, and permanent storage device 602. From these various memory units, processing unit(s) 612 retrieves instructions to execute and data to process in order to execute the processes of the subject disclosure. The processing unit(s) 612 can be a single processor or a multi-core processor in different implementations.

ROM 610 stores static data and instructions that are needed by processing unit(s) 612 and other modules of the electronic system. Permanent storage device 602, on the other hand, is a read-and-write memory device. This device is a non-volatile memory unit that stores instructions and data even when electronic system 600 is off. One or more implementations of the subject disclosure use a mass-storage device (such as a magnetic or optical disk and its corresponding disk drive) as permanent storage device 602.

Other implementations use a removable storage device (such as a floppy disk, flash drive, and its corresponding disk drive) as permanent storage device 602. Like permanent storage device 602, system memory 604 is a read-and-write memory device. However, unlike storage device 602, system memory 604 is a volatile read-and-write memory, such as random access memory. System memory 604 stores any of the instructions and data that processing unit(s) 612 needs at runtime. In one or more implementations, the processes of the subject disclosure are stored in system memory 604, permanent storage device 602, and/or ROM 610. From these various memory units, processing unit(s) 612 retrieves instructions to execute and data to process in order to execute the processes of one or more implementations.

Bus 608 also connects to input and output device interfaces 614 and 606. Input device interface 614 enables a user to communicate information and select commands to the electronic system. Input devices used with input device interface 614 include, for example, alphanumeric keyboards and pointing devices (also called "cursor control devices"). Output device interface 606 enables, for example, the display of images generated by electronic system 600. Output devices used with output device interface 606 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 6, bus 608 also couples electronic system 600 to a network (not shown) through network interface 616. In this manner, the computer can be a part of a network of computers (such as a local area network ("LAN"), a wide area network ("WAN"), or an Intranet, or a network of networks, such as the Internet. Any or all components of electronic system 600 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable and/or rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. A method for uplink scheduling in a satellite long-term evolution (LTE) network, the method comprising:
   receiving, at a satellite base station, a scheduling request from a terminal device;
   transmitting an initial uplink grant to the terminal device with an initial allocation that supports a configured data rate and indicates one or more resources with corresponding access periodicities and durations; and
   in response to transmitting the initial uplink grant, periodically receiving user data from the terminal device based on the initial allocation without sending multiple uplink grants to the terminal device for multiple individual user data received from the terminal device.

2. The method of claim 1, further comprising periodically receiving a buffer status report (BSR) message from the terminal device to update allocated resources.

3. The method of claim 1, further comprising occasionally transmitting an additional uplink grant to the terminal device to update the initial allocation based on BSR information.

4. The method of claim 1, wherein the initial uplink grant is transmitted using a downlink control information-0 (DCI-0) message on a physical downlink control channel (PDCCH).

5. The method of claim 1, wherein the initial allocation includes information regarding allocation of resources, a periodicity and a time duration for user data reception from the terminal device.

6. The method of claim 5, wherein periodically receiving user data from the terminal device is based on allocated resources and at time intervals determined by the periodicity and until an end of the time duration.

7. The method of claim 5, further comprising asynchronously updating allocation of resources based on establishment of guaranteed bit rate bearers and by taking into account resource allocation to other users.

8. A method for downlink scheduling in a satellite long-term evolution (LTE) network, the method comprising:
   scheduling by a satellite base station receptions of user data from a plurality of terminal devices;
   transmitting an initial downlink control information (DCI) message to a terminal device of the plurality of terminal devices to provide the terminal device with downlink information; and
   periodically transmitting multiple user data to the terminal device based on the initial DCI message without sending multiple DCI messages to the terminal device for the multiple user data transmitted to the terminal device.

9. The method of claim 8, wherein the downlink information includes resource block containing user data, a frequency and a time duration associated with user data transmission to the terminal device.

10. The method of claim 8, wherein the DCI message is transmitted on a physical downlink control channel (PDCCH).

11. The method of claim 8, further comprising updating downlink information by sending an additional DCI message to the terminal device.

12. The method of claim 11, wherein the updated downlink information includes an indication of termination of user data transmission.

13. A system for efficient update to existing resource allocation for satellite long-term evolution (LTE) networks, the system comprising:
- a satellite base station; and
- a terminal device configured to communication with the satellite base station, wherein:
the satellite base station is configured to:
- receive a scheduling request from the terminal device;
- transmit an initial uplink grant to the terminal device with an initial allocation that supports a basic data rate and indicates one or more resources with corresponding access periodicities and durations; and
- in response to transmitting the initial uplink grant, periodically receive user data from the terminal device based on the initial allocation without sending multiple uplink grants to the terminal device for multiple user data received from the terminal device.

14. The system of claim 13, wherein the satellite base station is further configured to periodically receive a buffer status report (BSR) message from the terminal device to update persistent uplink resources.

15. The system of claim 13, wherein the satellite base station is further configured to occasionally transmit an additional uplink grant to the terminal device to update the initial allocation based on BSR information.

16. The system of claim 13, wherein the satellite base station is further configured to asynchronously update allocation of resources based on establishment of guaranteed bit rate bearers and by taking into account resource allocation to other users.

17. The system of claim 13, wherein the initial uplink grant is transmitted using a downlink control information-0 (DCI-0) message on a physical downlink control channel (PDCCH), and wherein the initial allocation includes information regarding allocation of resources, a periodicity and a time duration for user data reception from the terminal device.

18. The system of claim 13, wherein the satellite base station is further configured to:
- schedule receptions of user data;
- transmit a downlink control information (DCI) message to the terminal device to provide the terminal device with downlink information; and
- periodically transmit user data to the terminal device based on the downlink information without sending a respective DCI message to the terminal device for individual user data transmitted to the terminal device.

19. The system of claim 18, further comprising updating downlink information by sending an additional DCI message to the terminal device.

20. The system of claim 18, wherein the downlink information includes resource block containing user data, a frequency and a time duration associated with user data transmission to the terminal device, and wherein the updated downlink information includes an indication of termination of user data transmission.

* * * * *